United States Patent [19]

Hayafuji

[11] Patent Number: 4,592,799
[45] Date of Patent: Jun. 3, 1986

[54] METHOD OF RECRYSTALLIZING A POLYCRYSTALLINE, AMORPHOUS OR SMALL GRAIN MATERIAL

[75] Inventor: Yoshinori Hayafuji, Tokyo, Japan
[73] Assignee: Sony Corporation, Tokyo, Japan
[21] Appl. No.: 492,800
[22] Filed: May 9, 1983
[51] Int. Cl.[4] .............................................. C30B 1/08
[52] U.S. Cl. .................. 156/617 R; 156/DIG. 73; 156/DIG. 102; 427/43.1; 427/86; 148/1.5
[58] Field of Search ............ 156/617 R, DIG. 102, 156/DIG. 73, DIG. 80; 148/1.5; 29/576 B, 576 T; 427/43.1, 86; 250/492.3, 492.2; 219/121 EB; 357/23 TF

[56] References Cited

U.S. PATENT DOCUMENTS

| | | | |
|---|---|---|---|
| 2,729,748 | 1/1956 | Robinson . | |
| 3,144,552 | 8/1964 | Schonberg et al. | 250/49.5 |
| 3,193,717 | 7/1965 | Nunan | 313/76 |
| 3,600,237 | 8/1971 | Davis et al. | 156/617 |
| 3,614,423 | 10/1971 | Heymick et al. | 250/49.5 C |
| 3,702,412 | 11/1972 | Quintal | 313/299 |
| 3,745,396 | 7/1973 | Quintal et al. | 313/37 |
| 3,769,600 | 10/1973 | Denholm et al. | 328/233 |
| 3,780,308 | 12/1973 | Nabco | 250/492 |
| 3,780,334 | 12/1973 | Leboutet | 313/299 |
| 4,035,829 | 7/1977 | Ipri et al. | 357/23 TF |
| 4,061,944 | 12/1977 | Gay | 313/420 |
| 4,131,909 | 12/1978 | Matsude et al. | 357/23 TF |
| 4,151,422 | 4/1979 | Geto et al. | 250/492 A |
| 4,199,384 | 4/1980 | Hsu | 357/23 TF |
| 4,258,266 | 3/1981 | Robinson et al. | 250/492 A |
| 4,301,369 | 11/1981 | Matsno | 250/423 R |
| 4,309,225 | 1/1982 | Fan et al. | 156/DIG. 80 |
| 4,322,881 | 4/1982 | Enomoto et al. | 148/1.5 |
| 4,323,417 | 4/1982 | Lam | 156/613 |
| 4,330,363 | 5/1982 | Biegesen et al. | 156/620 |
| 4,358,326 | 11/1982 | Doo | 427/86 |
| 4,371,421 | 2/1983 | Fan et al. | 156/624 |
| 4,375,993 | 3/1983 | Mori et al. | 148/1.5 |
| 4,382,186 | 5/1983 | Denholm et al. | 250/492.2 |
| 4,448,632 | 5/1984 | Akaska | 156/603 |

FOREIGN PATENT DOCUMENTS

| | | |
|---|---|---|
| 11414 | 5/1980 | European Pat. Off. . |
| 2146941 | 9/1971 | Fed. Rep. of Germany . |
| 2228294 | 12/1972 | Fed. Rep. of Germany . |
| 57-21834 | 2/1982 | Japan .................. 29/576 T |
| 420395 | 3/1967 | Switzerland . |
| 1032071 | 6/1966 | United Kingdom . |

OTHER PUBLICATIONS

H. Schaber, D. Cutter, and W. M. Werner, Laser Annealing Study of the Grain Size Effect in Polycrystalline Silicon Schottky Diodes, J. Appl. Phys. 53 (12), Dec. 1982, pp. 8827-8834.

Primary Examiner—David L. Lacey
Attorney, Agent, or Firm—Lewis H. Eslinger; Alvin Sinderbrand

[57] ABSTRACT

For recrystallizing a layer of polysilicon extending over a layer of silicon dioxide on a substrate of silicon single crystal, the silicon dioxide layer is interrupted at seeding locations which are spaced apart in at least one direction and at which the polysilicon layer comes into contact with the substrate, an electron beam of generally strip-shaped cross section is impacted on the polysilicon layer where the beam is focused into a fine impact line of intense energy extending transverse to the one direction in which the seeding locations are spaced apart, the substrate and electron beam are relatively displaced in a direction transverse to the impact line so that the impact line of the beam relatively scans at least a portion of the polysilicon layer transversely to the direction in which the seeding locations are spaced apart, and the speed with which the impact line relatively scans the polysilicon layer is determined so that the polysilicon layer is subjected to zone melting at the impact line of the electron beam for growing silicon single crystals by lateral epitaxial recrystallization of the polysilicon from the seeding locations.

43 Claims, 14 Drawing Figures

METHOD OF RECRYSTALLIZING A POLYCRYSTALLINE, AMORPHOUS OR SMALL GRAIN MATERIAL

BACKGROUND OF THE INVENTION

1. Field of the Invention

The present invention relates to the recrystallizing of polycrystalline or amorphous or small grain material to produce as large a grain size as possible, and more particularly is directed to growing a single crystal structure by recrystallizing a polycrystalline or amorphous upper layer extending over an electrically isolating layer on a single crystal semiconductor substrate.

2. Description of the Prior Art

In growing a single crystal film from a polycrystalline or amorphous layer extending over an electrically isolating substrate, it has been proposed to use various conventional energy sources, such as, a spot laser beam, spot electron beam, graphite strip heater or arc strip lamp, to scan and thereby melt the polycrystalline layer so as to induce liquid or solid phase regrowth by epitaxial recrystallization.

However, such conventional energy sources have proven to be unsatisfactory. When spot beam energy sources are used to melt the polycrystalline layer, the resulting recrystallized layer typically lacks a uniform single crystalline structure. Such nonuniformity is due to the circular cross section of the beam which requires that the spot beam repeatedly scan the polycrystalline layer along overlapping paths, so that portions of the polycrystalline layer constituting 70 to 80 percent thereof are scanned more than once. Spot beam energy sources in repeatedly scanning portions of the polycrystalline layer, require an undesirable amount of time in order to scan the entire surface of the polycrystalline layer. Furthermore, the single crystalline structure that is obtained is not of high quality.

In employing conventional strip beam energy sources, such as, graphite strip heaters or arc strip lamps, to melt the polycrystalline layer, damage can occur to the underlying electrically isolating layer and semiconductor substrate. More particularly, such conventional strip beam energy sources cannot be sufficiently focused so that the energy density of the strip beam at its area of impact with the polycrystalline layer is less than desirable. Consequently, a relatively long time of contact of the beam with the polycrystalline layer is required to melt the latter which results in dissipation of an unacceptable amount of heat from the polycrystalline layer and possible damage to the underlying isolating layer and substrate. For example, a strip beam from a conventional strip arc lamp has to contact a polycrystalline layer of a thickness of one to three microns for about one second in order to melt such layer.

OBJECTS AND SUMMARY OF THE INVENTION

Accordingly, it is an object of the present invention to provide a method of recrystallizing a polycrystalline or amorphous material extending over an electrically isolating layer on a single crystal semiconductor substrate which avoids the drawbacks of the prior art.

More specifically, it is an object of the present invention to provide a new and improved method of recrystallizing a polycrystalline or amorphous material extending over an electrically isolating layer on a single crystal semiconductor substrate which results in the polycrystalline or amorphous material recrystallizing into a uniform single crystalline structure.

It is another object of the present invention to provide a method of melting a polycrystalline or amorphous material extending over an electrically isolating layer on a single crystal semiconductor substrate so as to induce lateral epitaxial recrystallization of the polycrystalline or amorphous material, and in which less time is required to melt the polycrystalline or amorphous material as compared with the prior art.

It is still another object of the present invention to provide a method of recrystallizing a polycrystalline or amorphous material extending over an electrically isolating layer on a single crystal semiconductor substrate which substantially avoids damage to the electrically insolating layer and substrate during melting of the polycrystalline or amorphous material.

In accordance with an aspect of this invention, a method of recrystallizing a polycrystalline or amorphous upper layer extending over an electrically isolating layer on a single crystal semiconductor substrate comprises interrupting said isolating layer at seeding locations which are spaced apart in at least one direction and at which said polycrystalline or amorphous upper layer comes into contact with said substrate, impacting on said upper layer an electron beam of generally strip-shaped cross section which is focused at said upper layer into a fine impact line of intense energy to which said one direction is transverse, relatively displacing said substrate and electron beam in said one direction transverse to said impact line so that said impact line of the beam relatively scans at least a portion of said polycrystalline or amorphous upper layer in said transverse direction, and determining the speed with which said impact line relatively scans the upper layer so that the latter is subjected to zone melting at said impact line of the electron beam for growing single crystals by lateral epitaxial recrystallization of said polycrystalline or amorphous upper layer from said seeding locations.

In embodiments of the above method according to this invention, thermally conducting elements may be disposed above said seeding locations to act as heat sinks when impacted by said electron beam, and/or $SiO_n$, in which $n \leq 2$, or $Si_xN_y$, in which x and y are positive numbers can be used as the electrically isolating layer for equalizing the amounts of energy required to effect melting of the upper layer at all portions thereof.

Further, it is a feature of this invention, that the substrate is a wafer having a crystallographic orientation, and the electron beam is made to scan along a direction substantially perpendicular to the crystallographic orientation for growing single crystals of increased size.

It is still another feature of the present invention to provide a polycrystalline or amorphous layer between the electrically isolating layer and the substrate for reducing thermal stressing between the electrically isolating layer and the substrate.

The above and other objects, features, and advantages of this invention will become apparent from the following detailed description which is to be read in conjunction with the accompanying drawings.

DETAILED DESCRIPTION OF PREFERRED EMBODIMENTS

The provision of a thin, single-crystal silicon film on an insulating layer, commonly referred to as a silicon-on-insulator or SOI, has become quite important in the formation of multiple active layers in silicon integrated circuitry.

Before proceeding to describe certain preferred embodiments of the present invention in detail and in order to more clearly understand the same, it is to be understood that the notations <x,y,z> or [x,y,z] will be used hereinafter to describe "direction" in terms of coordinates x, y, and z, with a bar over a coordinate, such as $\bar{x}$, denoting a negative direction. Thus, for example, [100] or <100> denotes a direction of one positive unit along the x axis, [0$\bar{1}$0] or <0$\bar{1}$0> denotes a direction of one negative unit along the y axis and [001] or <001> denotes a direction of one positive direction along the z axis. It is also to be understood that the orientation of a planar surface is defined in terms of the normal thereto and is denoted by the notation {x,y,z}. Thus, a planar surface in the x-y plane has an orientation along the z axis, that is, for example, a {001} orientation.

Figure 2:
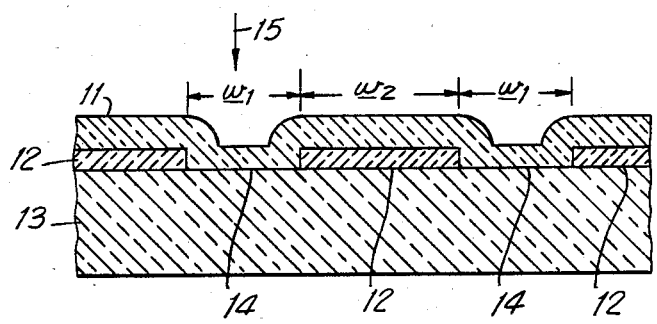
FIG. 2 is a sectional view taken along the line II—II on FIG. 1.
Figure 2:
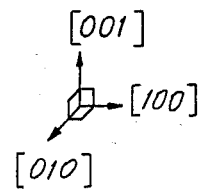

Referring now to FIG. 2, it will be seen that, for providing a thin single-crystal film on an insulating layer by a method according to the present invention, initially a polycrystalline or amorphous upper layer 11 is suitably deposited over an electrically isolating layer 12 on a single crystal semiconductor substrate 13. Upper layer 11 may be formed of, but is not limited to, polycrystalline materials, such as silicon, germanium, 3—5 compound semiconductors, silicon carbide, germanium arsenic, and germanium phosphate. Electrically isolating layer 12 typically is silicon dioxide but can be any other suitable electrically isolating material. Substrate 13 may be of single crystal silicon, diamond, sapphire or any other suitable single crystalline structure.

As shown particularly in FIG. 2, in accordance with this invention, electrically isolating layer 12 is interrupted at seeding locations 14 so as to form islands which are spaced apart in one direction, such as along a [100] direction. Thus, polycrystalline or amorphous upper layer 11 contacts substrate 13 at seeding locations 14.

Figure 1:
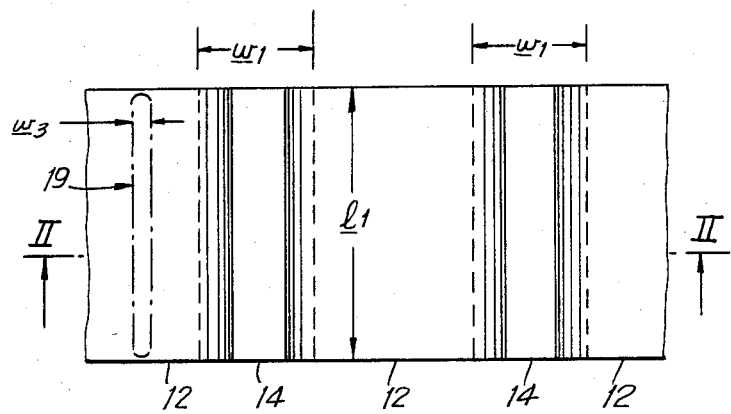
FIG. 1 is a top plan view of a polycrystalline or amorphous layer extending over an electrically isolating layer on a single crystal semiconductor substrate and which is to be recrystallized in accordance with an embodiment of the present invention.
Figure 3:
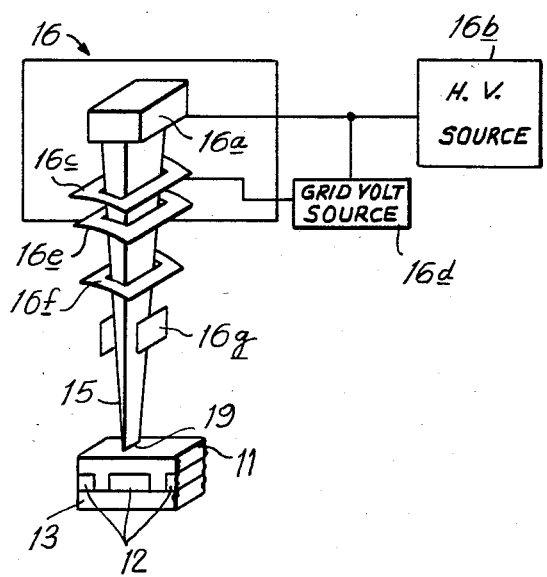
FIG. 3 is a schematic diagram of an apparatus for generating an electron strip beam used in accordance with an embodiment of the present invention.

Upper layer 11 is melted by an electron beam 15 of a generally strip-shaped cross-section which is focused at layer 11 so as to impact thereagainst it a fine line 19 of intense energy. More particularly, as shown in FIG. 3, a strip electron beam 15 suitable for use in accordance with this invention can be formed by extractions of electrons from a uniformly emitting rectangular thermionic cathode 16a of high respect ratio, with the length of the strip cathode being made comparable to the width of the area to be processed, that is the treated target area, and with the narrow cathode dimension being chosen to be compatible with long-term, uniform cathode emission and the desired compression of electron beam 15. A suitable high voltage source 16b is connected to cathode 16a so as to heat the latter. An extraction grid 16c connected to a grid control voltage source 16d, is spaced a few millimeters from cathode 16a, with a permeance such that the required current density can be obtained with a few kilovolts or less of an extraction pulse. A narrow strip electron beam is injected at an aperture 16e in a main electrostatic accelerating gap. The geometry of aperture 16e is such that the electric field further focuses the strip laterally during the initial stages of acceleration in the electrostatic accelerating main gap. Electron beam 15 is then directed through ground aperture 16f to impact upon upper layer 11. Displacement of electron beam 15 relative to substrate 13 for causing impact line 19 to scan upper layer 11 may be effected by a deflection system including electrostatic plates 16g which are suitably energized to cause deflection of electron beam 15 at right angles to the transverse strip length. For example, referring to FIG. 1, impact line 19 may be made to travel in a [100] direction, which is the direction in which seeding locations 14 are spaced apart. Thus, in melting an area or zone of upper layer 11, hereinafter referred to as zone melting, at impact line 19 for growing single crystals by lateral epitaxial recrystallization of upper layer 11 from seeding locations 14, electron beam 15 is displaced relative to substrate 13 along, for example, the [100] direction so that impact line 19 scans at least a portion of upper layer 11. Alternatively, scanning of the surface of upper layer 11 by impact line 19 can be achieved by maintaining beam 15 stationary and suitably moving substrate 13 relative thereto in the [100] direction.

A typical example of making an SOI in accordance with an embodiment of the present invention is as follows: On substrate 13, comprising a single crystal silicon wafer of a {001} orientation having a resistance per centimeter of 8–12 ohms, a diameter of 75 millimeters and a thickness of approximately 380 microns, a film of $SiO_2$ having about a 0.5 micron thickness is thermally grown after two hours at approximately 1,000° C. The $SiO_2$ film is photolithographically etched away so as to form seeding areas 14 therein each having a width $\omega_1$ of 30 to 100 microns and separating $SiO_2$ islands each having a width $\omega_2$ of 30 to 100 microns and a length $l_1$ of 2 centimeters. The long sides of the $SiO_2$ islands are substantially parallel to the [010] direction and the short sides thereof are substantially parallel to the [100] direction. A polysilicon film having a thickness of about 0.5 microns is then deposited over the entire upper surface of the substrate wafer with the etched $SiO_2$ or electrically isolating layer thereon by means of chemical vapor deposition using a mixture of $SiH_4$ and $N_2$ at 650° C. so as to form upper layer 11. The sandwich of polysilicon, $SiO_2$ and silicon is disposed in a receptacle which is vacuum-pumped to a pressure of less than $2 \times 10^{-7}$ Torrs, whereupon electron beam 15 is focused on a narrow strip of upper layer 11 which is approximately 60 microns wide and 3 centimeters long. Electron beam 15 has an average energy density of 0.7 $MW/cm^2$ at approximately 10 kv and at a target current of about 1.0 to 1.3 amperes. Finally, the sandwich is irradiated for 0.1 to 2 milliseconds while being relatively displaced in direction [100] with respect to electron beam 15 at a speed of up to 500 cm/sec.

Figure 4:
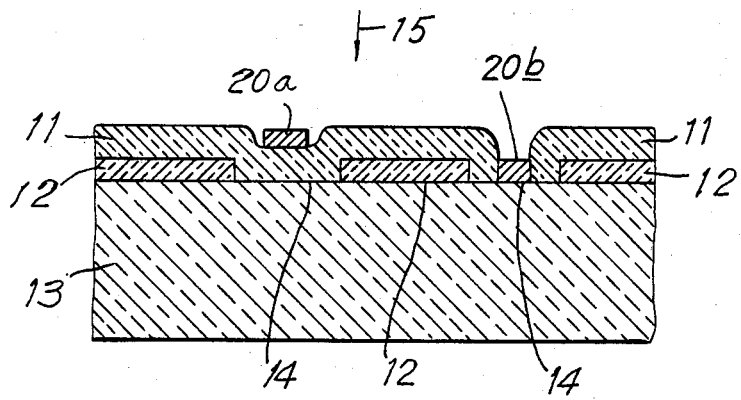
FIGS. 4–8 are sectional views similar to that of FIG. 2, but illustrating other respective embodiments of the invention.

When using polysilicon as upper layer 11, SiO$_2$ as electrically isolating layer 12, and Si as substrate 13, it has been observed that the threshold energy level required to melt upper layer 11 on substrate 13, that is, at the portions of layer 11 above seeding locations 14, is about 20% higher than the threshold energy level required to melt portions of upper layer 11 superposed on electrically isolating layer 12. Such differences in the threshold energy levels are due to the relative higher thermal insulating properties of SiO$_2$ as compared to Si which result in relatively more heat being retained in those portions of the polysilicon film which are directly above the SiO$_2$ islands than in those portions of the polysilicon film which are directly above seeding locations 14. As a consequence thereof, those portions of the polysilicon film in direct contact with the SiO$_2$ islands may begin to evaporate before those portions of the former which are in direct contact with the Si substrate can be melted. In order to substantially avoid such an undesirable consequence, one or more of the following measures may be adopted in methods according to this invention for reducing such differences in the threshold energy levels;

As shown in FIG. 4, thermally conducting elements may be disposed above seeding locations 14 as at 20$a$ or 20$b$, to act as heat sinks when impacted by electron beam 15 so as to retain and concentrate heat in those portions of upper layer 11 which are proximate seeding locations 14. Consequently, the amounts of energy required to melt all portions of upper layer 11 are more nearly equalized. As further shown in FIG. 4, the thermally conducting elements may be superposed on upper layer 11, as at 20$a$ or, disposed so as to be in contact with substrate 13, as at 20$b$. Thermally conducting elements 20$a$ and 20$b$ may be of a refractory metal, such as, for example, platinum silicide, tungsten silicide and molybdenum silicide.

The threshold energy levels required to melt all portions of the polysilicon film 11 may be substantially equalized by utilizing, for electrically isolating layer 12, a material which is substantially less of a heat insulator than SiO$_2$. Thus, for example, semiheat-insulating materials, such as, SiOn where n is less than 2, Si$_x$N$_y$ where x and y are positive numbers or Al$_2$O$_3$, can be used for the electrically isolating layer 12.

Another measure for more nearly equalizing the threshold energy levels required to effect melting of all portions of upper layer 11 involves reducing the thickness of electrically isolating layer 12 to, for example, a thickness of less than 0.5 microns. As will be readily appreciated, as the thickness of electrically isolating layer 12 is reduced its heat insulating property is correspondingly reduced with the result that the amounts of heat retained in the portions of upper layer 11 superposed on the islands of layer 12 are reduced for more nearly equalizing the threshold energy levels required to effect melting of all portions of layer 11.

Figure 5:
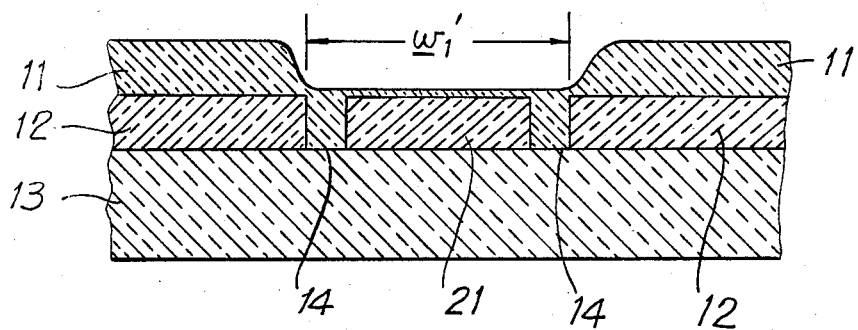

Still another measure for equalizing the threshold energy levels is to make as small as possible the width $\omega_1$, of the seeding locations 14 between electrically isolating islands of layer 12 so as to significantly reduce the amounts of heat energy flowing directly into substrate 13 at the seeding locations. Alternatively, and as shown in FIG. 5, if electrically isolating layer 12 has to have a surface pattern resulting in wide spaces or areas between the islands thereof, as at $\omega_1'$, island 21 of electrically isolating material or of a material with similar heat insulating properties, may be interposed in each seeding area 14 in order to reduce the heat energy flow into substrate 13. Thus, the threshold energy levels required to effect melting of upper layer 11 at all portions thereof are substantially equalized.

Figure 6:
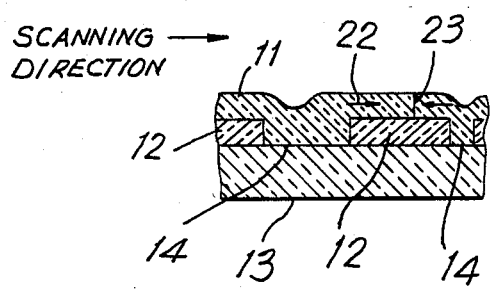
Figure 7:
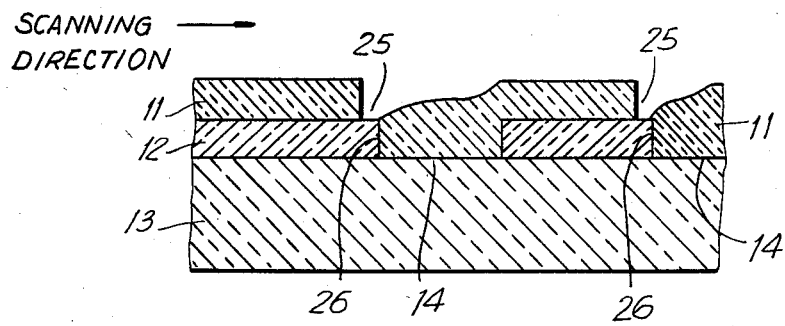

It is further to be noted that the paths of recrystallization of upper layer 11 can occur in both the direction of relative scanning by electron beam 15 and in a direction opposite thereto. More specifically, as shown in FIG. 6, the path or direction of recrystallization of layer 11 indicated by the arrow 22 is desirably in the same direction as the scanning direction of beam 15. However, a path or direction 23 of recrystallization opposite to path 22 can appear which causes a discontinuity, that is, a defect in the crystalline structure at boundary 24. In order to avoid such defects, as shown in FIG. 7, upper layer 11 is interrupted or removed to form gaps 25 therein above electrically isolating layer 12 at borders 26 of seeding locations 14 which are at the sides of the latter opposite to the scanning direction. Such gaps 25 effectively suppress recrystallization of upper layer 11 in a path or direction opposite to the scanning direction.

Figure 8:
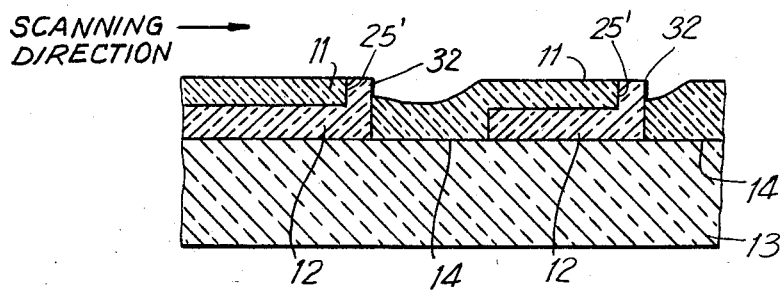

Alternatively, as shown in FIG. 8, recrystallization in the reverse direction and the consequent defects can be prevented by extending electrically isolating layer 12 into interrupted portions 25' of upper layer 11 as indicated at 32, so as to block the growth in the reverse direction. Thus, in FIGS. 7 and 8, lateral epitaxial recrystallization of upper layer 11 occurs only in the scanning direction of electron beam 15 from each seeding location 14.

The speed $v_s$ at which electron beam 15 should relatively scan upper layer 11 in order to achieve so-called "zone melting" can be determined from the following:

$$v_s \leq \omega_3/Y \tag{1}$$

in which $\omega_3$ is the width of the impact area 19 of the beam 15 on layer 11, and Y is the time required for upper layer 11 to return from a liquid state to a solid state after it has been melted by beam 15. Such "zone melting" is a necessary condition for promoting lateral epitaxial growth of single crystal.

It will be apparent from equation (1) that the scanning speed $v_s$ for zone melting is inversely proportional to Y. In general, it is desirable to use as high a scanning speed as possible consistent with zone melting and, therefore, a low value of Y is desired. The value of Y is dependent on many factors, such as, the thickness of layers 11 and 12, the temperature at which the upper layer 11 melts, and the pressure of the atmosphere in which the zone melting is effected. Further, some of the measures previously described for equalizing the threshold energy levels at all portions of upper layer 11 with decrease the value of Y, whereas others of such measures will increase the value of Y. For example, when thermally conducting elements 20$a$ or 20$b$ are disposed above seeding locations 14, as on FIG. 4, as a portion of upper layer 11 between seeding locations 14 begins to cool following the passage of beam 15, thermally conducting elements 20$a$ or 20$b$ adjacent such portion of layer 11 will conduct heat energy therefrom so as to decrease the time Y required to restore layer 11 from the liquid state to its solid state. In that case, the value of $v_s$ is desirably increased. On the other hand, if the widths $\omega_1$ of seeding locations 14 are reduced for minimizing the heat dissipation at the seeding locations with a view to equalizing the threshold energy levels at such seeding locations and at the portions of upper layer 11 therebetween, the reduction of heat dissipation at seeding locations 14 will also reduce the rate of cooling of the upper layer 11 after the melting thereof and thereby increase the value of Y and correspondingly decrease the value of $v_s$. Therefore, in the case where a measure adopted for equalizing the threshold energy levels, such as, reducing the widths $\omega_1$, has the tendency to increase Y, resort is simultaneously had to other measures, such as, reducing the thickness of layer 12 or forming the latter a material with less pronounced heat insulating properties, so as to decrease Y and desirably increase the speed $v_s$ for zone melting.

For obtaining a long and large single recrystallized structure, the crystallographic orientation of substrate 13, the pattern of the islands defined by the gaps in electrically isolating layer 12 forming seeding locations 14, and the direction of relative displacement of substrate 13 with respect to electron beam 15 need to be taken into account. More particularly, electron beam 15 should scan along a direction which is substantially perpendicular to the crystallographic orientation of the substrate. Furthermore, electron beam 15 should scan upper layer 11 along a direction which is parallel to the direction in which the islands of layer 12 are spaced apart by seeding locations 14 or parallel to one of two directions which define the pattern of electrically isolating layer 12, such as, when the islands of layer 12 are defined between a grid of seeding locations extending in orthogonally related directions, respectively.

Figure 9A:
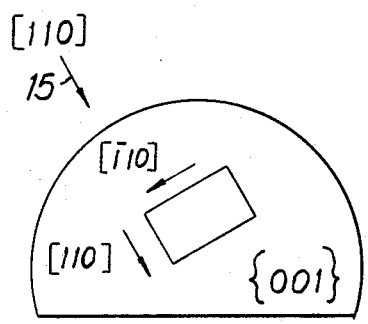
FIGS. 9A–9E are schematic top views of electrically isolating layers grown on wafers having different orientations and which are scanned by respective electron beams.
Figure 9B:
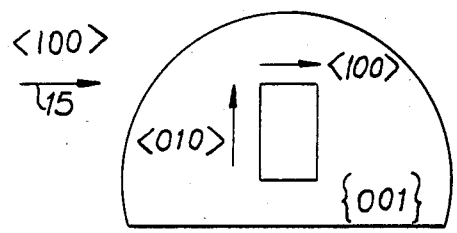
Figure 9C:
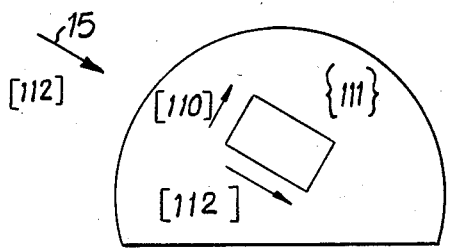
Figure 9D:
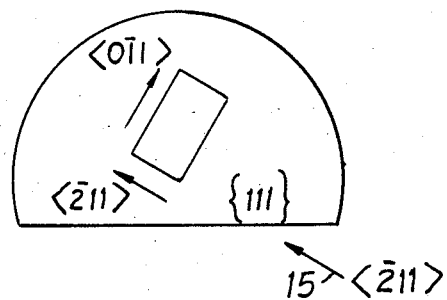
Figure 9E:
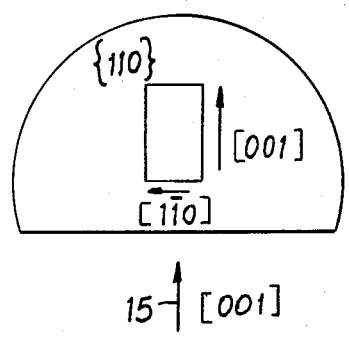

By way of example, and assuming that substrate 13 is a semiconductor wafer, then, as shown in FIG. 9A, a {001} wafer having an electrically isolating layer 12 grown thereon in the form pattern of islands spaced apart in the direction [110] or the directions [110] and [1̄10] should have electron beam 15 scanning in one of those directions, for example, the direction [110]. Alternatively, as shown on FIG. 9B, a {001} wafer having an electrically isolating layer 12 grown thereon so as to present a pattern of islands spaced apart in directions <100> or in directions <100> and <010> should have electron beam 15 scanning in the direction <100>. As shown in FIG. 9C, for a {111} wafer having an electrically isolating layer 12 grown thereon to present a pattern of islands spaced apart in the direction [112] or in the directions [112] and [1̄10], electron beam 15 should scan along the direction [112]. Alternatively, as shown on FIG. 9D, a {111} wafer having an electrically isolating layer 12 that defines a pattern of islands spaced apart in the direction <2̄11> or in the directions <2̄11> and <01̄1> should have an electron beam 15 scanning in the direction <2̄11>. Finally, as shown on FIG. 9E, a {110} wafer having an electrically isolating layer 12 grown thereon to define a pattern of islands spaced apart in the direction [001] or in the directions [001] and [1̄10] should have electron beam 15 scanning in the [001] direction.

Figure 10:
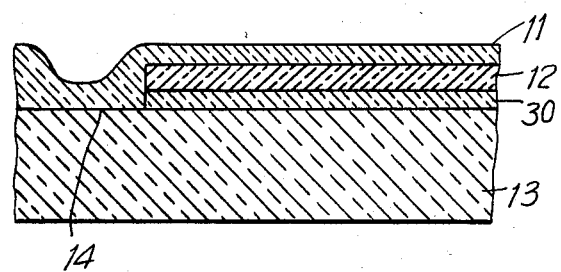
FIG. 10 is a sectional view similar to that of FIG. 2 and illustrating still another embodiment of the invention.

It is also to be noted that, because of different thermal coefficients of expansion of electrically isolating layer 12 and substrate 13, as electron beam 15 scans upper layer 11, irregular partial melting can occur at the interface of electrically isolating layer 12 and substrate 13. More specifically, thermal expansion stressing can occur along the interface between electrically isolating layer 12 and substrate 13 and can result in the introduction of defects in the recrystallized structure of upper layer 11. Referring now to FIG. 10, it will be seen that, to prevent such thermal stresses, a polycrystalline or amorphous layer 30 is provided between substrate 13 and electrically isolating layer 12. Such polycrystalline or amorphous layer 30 should be of a random material having a high disorder so that atoms can move relatively easily in all directions and thereby provide a means for the relaxation of areas of high thermal stress occurring between electrically isolating layer 12 and substrate 13. Amorphous layer 30 can comprise Si, $SiO_n$ where n is less than 2, or any other suitable polycrystalline material.

It will be appreciated from the foregoing, that the present invention provides a new and improved method of recrystallizing a polycrystalline or amorphous material extending over an electrically isolating layer on a single crystal semiconductor substrate. In particular, the present invention provides a method for recrystallizing, a polycrystalline or amorphous material having a uniform single crystalline structure by lateral epitaxial recrystallization of the polycrystalline or amorphous material from spaced apart seeding locations. Additionally, the present invention provides a method which minimizes the time required to melt the polycrystalline or amorphous material, while substantially avoiding damage to the electrically isolating layer and substrate during melting of the polycrystalline or amorphous material.

Having specifically described illustrative embodiments of the invention with reference to the accompanying drawings, it is to be understood that the invention is not limited to those precise embodiments and that various changes and modifications may be effected therein by one skilled in the art without departing from the scope and spirit of the invention as defined in the appended claims.

I claim:
1. A method of recrystallizing a polycrystalline or amporphous upper layer extending over an electrically isolating layer on a single crystal semiconductor substrate comprising:
   interrupting said isolating layer at seeding locations which are spaced apart in at least one direction and at which said upper layer comes into contact with said substrate;
   directing onto said upper layer an electron beam of generally strip-shaped cross section which is focused at said upper layer into a fine impact line of intense energy, said impact line extending in a direction transverse to one of said at least one direction;
   relatively displacing said substrate and electron beam in said one direction so that said impact line effects a scan of at least a portion of said upper layer in said one direction; and
   controlling the speed of said scan so that

$$v_s \leq \omega_3/Y$$

where $v_s$ is said speed, $\omega_3$ is the width of said impact line in said one direction and Y is the time required for said upper layer to return from a liquid state to a solid state after it has been melted by said electron beam, said upper layer undergoing zone melting at said impact line, whereby single crystals are grown by lateral epitaxial recrystallization of said upper layer from said seeding location.

2. A method of recrystallizing a polycrystalline or amorphous upper layer as in claim 1; further comprising disposing thermally conducting elements above said seeding locations to act as sinks for heat generated by said electron beam.

3. A method of recrystallizing a polycrystalline or amorphous upper layer as in claim 2; wherein said thermally conducting elements are superposed on said upper layer.

4. A method of recrystallizing a polycrystalline or amorphous upper layer as in claim 2; wherein said thermally conducting elements are in contact with said substrate.

5. A method of recrystallizing a polycrystalline or amorphous upper layer as in claim 2; wherein said thermally conducting elements comprise a refractory metal.

6. A method of recrystallizing a polycrystalline or amorphous upper layer as in claim 2; wherein said thermally conducting elements comprise a refractory metal alloy selected from the group consisting of platinum silicide, tungsten silicide and molybdenum silicide.

7. A method of recrystallizing a polycrystalline or amorphous upper layer as in claim 1; wherein said electrically isolating layer comprises silicon dioxide.

8. A method of recrystallizing a polycrystalline or amorphous upper layer as in claim 1; wherein said electrically isolating layer comprises a material selected from the group consisting of $Al_2O_3$, $SiO_n$ where $n<2$ and $Si_xN_y$ where x and y are positive numbers.

9. A method of recrystallizing a polycrystalline or amorphous upper layer as in claim 1; wherein said electrically isolating layer has a thickness of less than 0.5 microns.

10. A method of recrystallizing a polycrystalline or amorphous upper layer as in claim 1; further comprising substantially equalizing the amounts of energy required to effect melting of said upper layer at all portions thereof.

11. A method of recrystallizing a polycrystalline or amorphous upper layer as in claim 10; further comprising suppressing crystal growth from said seeding locations in a direction reverse to that in which said impact line scans by interrupting portions of said upper layer which are above said electrically isolating layer at borders of said seeding locations.

12. A method of recrystallizing a polycrystalline or amorphous upper layer as in claim 11; wherein said electrically isolating layer extends into the interrupted portions of said upper layer.

13. A method of recrystallizing a polycrystalline or amorphous upper layer as in claim 1; wherein said substrate is a wafer having a crystallographic orientation, and said electron beam scans along a direction substantially perpendicular to said crystallographic orientation.

14. A method of recrystallizing a polycrystalline or amorphous upper layer as in claim 13; wherein the interruptions in said electrically isolating layer define a pattern of island-like portions of said isolating layer space apart in at least said one direction.

15. A method of recrystallizing a polycrystalline or amorphous upper layer as in claim 14; wherein the interruptions in said electrically isolating layer define a pattern of island-like portions spaced apart in two directions which are perpendicular to each other.

16. A method of recrystallizing a polycrystalline or amorphous upper layer as in claim 14; wherein said wafer has a {111} orientation, said electrically isolating layer has said island-like portions spaced apart in a [112] direction, and said electron beam scans along said direction [112].

17. A method of recrystallizing a polycrystalline or amorphous upper layer as in claim 16; wherein said island-like portions are also spaced apart in a [110] direction.

18. A method of recrystallizing a polycrystalline or amorphous upper layer as in claim 14; wherein said wafer has a {111} orientation, said electrically isolating layer has said island-like portions thereof spaced apart in a $<\bar{2}11>$ direction and said electron beam scans along said direction $<\bar{2}11>$.

19. A method of recrystallizing a polycrystalline or amorphous upper layer as in claim 18; wherein said island-like portions are also spaced apart in a $<0\bar{1}1>$ direction.

20. A method of recrystallizing a polycrystalline or amorphous upper layer as in claim 14; wherein said wafer has a {001} orientation and said electron beam scans in a [110] direction; and wherein said island-like portions of the electrically isolating layer are spaced apart in said [110] direction.

21. A method of recrystallizing a polycrystalline or amorphous upper layer as in claim 20; wherein said island-like portions are also spaced apart in a [$\bar{1}$10] direction.

22. A method of recrystallizing a polycrystalline or amorphous upper layer as in claim 14; wherein said wafer has a {001} orientation and said electron beam scans in a $<100>$ direction; and wherein said island-like portions of the electrically isolating layer are spaced apart in said $<100>$ direction.

23. A method of recrystallizing a polycrystalline or amorphous upper layer as in claim 22; wherein said island-like portions are also spaced apart in $<010>$ direction.

24. A method of recrystallizing a polycrystalline or amorphous upper layer as in claim 14; wherein said wafer has a {110} orientation, said electrically isolating layer has said island-like portions thereof spaced apart in [001] and [1$\bar{1}$0] directions, and said electron beam scans along a [001] direction.

25. A method of recrystallizing a polycrystalline or amorphous upper layer as in claim 1; further comprising interposing a polycrystalline or amorphous layer between said electrically isolating layer and said substrate.

26. A method of recrystallizing a polycrystalline or amorphous upper layer as in claim 25; wherein said polycrystalline or amorphous layer comprises polysilicon, said electrically isolating layer comprises silicon dioxide and said substrate comprises silicon single crystal.

27. A method of recrystallizing a polycrystalline or amorphous upper layer extending over an electrically isolating layer on a single crystal semiconductor substrate comprising:
   interrupting said isolating layer at seeding locations which are spaced apart in one direction and at which said polycrystalline or amorphous upper layer comes into contact with said substrate;
   directing onto said upper layer a beam from an energy source of generally strip-shaped cross section which is focused at said upper layer;
   relatively displacing said substrate and said beam in said one direction to effect a scan of at least a portion of said upper layer in said one direction;
   controlling the speed of said scan so that $$v_s \leq \omega_3/Y$$

where $v_s$ is said speed, $\omega_3$ is the width of said strip-shaped cross section at said upper layer and in said one direction and Y is the time required for said upper layer to return from a liquid state to a solid state after it has been melted by said beam, said upper layer undergoing zone melting by said beam, whereby single crystals are grown by lateral epitaxial recrystallization of said upper layer from said seeding locations; and substantially equalizing the the amounts of energy required to effect melting of said upper layer at all portions thereof.

28. A method of recrystallizing a polycrystalline or amorphous upper layer as in claim 27; further comprising suppressing crystal growth from said seeding locations in a direction reverse to that of said scan by interrupting portions of said upper layer which are above said electrically isolating layer at borders of said seeding locations.

29. A method of recrystallizing a polycrystalline or amorphous upper layer as in claim 28; wherein said electrically isolating layer extends into the interrupted portions of said upper layer.

30. A method of recrystallizing a polycrystalline or amorphous upper layer extending over a electrically isolating layer on a single crystal semiconductor wafer having a crystallographic orientation comprising:

interrupting said isolating layer at seeding locations which are spaced apart in one direction and at which said upper layer comes into contact with said wafer;

directing onto said upper layer a beam from an energy source of generally strip-shaped cross section which is focused at said upper layer;

relatively displacing said wafer and said beam in said one direction so that said beam effects a scan of at least a portion of said upper layer, said one direction being substantially perpendicular to said crystallographic orientation; and controlling the speed of said scan so that $$v_s \leq \omega_3/Y$$

where $v_s$ is said speed, $\omega_3$ is the width of sid strip-shaped cross section at said upper layer and in said one direction and Y is the time required for said upper layer to return from a liquid state to a solid state after it has been melted by said beam, said upper layer undergoing zone melting by said beam, whereby single crystals are grown by lateral epitaxial recrystallization of said upper layer from said seeding locations.

31. A method of recrystallizing a polycrystalline or amorphous upper layer as in claim 30; wherein the interruptions in said electrically isolating layer define a pattern of island-like portions of said isolating layer spaced apart in at least said one direction.

32. A method of recrystallizing a polycrystalline or amorphous upper layer as in claim 31; wherein said interruptions of electrically isolating layer define a pattern of said island-like portions which are spaced apart in two directions which are perpendicular to each other.

33. A method of recrystallizing a polycrystalline or amorphous upper layer as in claim 30; wherein said wafer has a (001) orientation, said electrically isolating layer is $SiO_2$ and has said island-like portions spaced apart in a [110] direction, and said beam scans along a [110] direction.

34. A method of recrystallizing a polycrystalline or amorphous upper layer as in claim 33; wherein said island-like portions are also spaced apart in a [$\bar{1}$10] direction.

35. A method of recrystallizing a polycrystalline or amorphous upper layer as in claim 30; wherein said wafer has a {001} orientation and said electron beam scans in a <100> direction; and wherein said island-like portions of electrically isolating layer are spaced apart in a <100> direction.

36. A method of recrystallizing a polycrystalline or amorphous upper layer as in claim 35; wherein said island-like portions are also spaced apart in a <010> direction.

37. A method of recrystallizing a polycrystalline or amorphous upper layer as in claim 30; wherein said wafer has a {111} orientation, said electrically isolating layer is $SiO_2$ and has said island-like portions psaced apart in a [112] direction, and said beam scans along a direction [112].

38. A method of recrystallizing a polycrystalline or amorphous upper layer as in claim 37; wherein said island-like portions are also spaced apart in a [110] direction.

39. A method of recrystallizing a polycrystalline or amorphous upper layer as in claim 30; wherein said wafer has a {111} orientation, said island-like portions of the electrically isolating layer are spaced apart in a <$\bar{2}$11> direction and said electron beam scans along a direction <$\bar{2}$11>.

40. A method of recrystallizing a polycrystalline or amorphous upper layer as in claim 39; wherein said island-like portions are also spaced apart in a <0$\bar{1}$1> direction.

41. A method of recrystallizing a polycrystalline or amorphous upper layer as in claim 30; wherein said wafer has a {110} orientation, said electrically isolating layer is $SiO_2$ and has said island-like portions spaced apart in [001] and [1$\bar{1}$0] directions, and said beam scans along a direction [001].

42. A method of recrystallizing a polycrystalline or amorphous upper layer extending over an electrically isolating layer on a single crystal semiconductor substrate comprising:

interrupting said isolating layer at seeding locations which are spaced apart in one direction;

interposing a polycrystalline or amorphous layer between said electrically isolating layer and said substrate;

directing onto said upper layer a beam from an energy source of generally strip-shaped cross section which is focused at said upper layer;

relatively displacing said substrate and said beam in said one direction so that said beam effects a scan of a least a portion of said upper layer; and controlling the speed of said scan so that $$v_s \leq \omega_3/\tau$$

where $v_s$ is said speed, $\omega_3$ is the width of said strip-shaped cross section at said upper layer and in said one direction and $\tau$ is the time required for said upper layer to return from a liquid state to a solid state after it has been melted by said beam, said upper layer undergoing zone melting by said beam, whereby single crystals are grown by lateral epitaxial recrystallization of said upper layer from said seeding location.

43. A method of recrystallizing a polycrystalline or amorphous upper layer as in claim 42; wherein said upper layer comprises polysilicon, said electrically isolating layer comprises silicon dioxide and said substrate comprises silicon single crystal.

* * * * *